(12) United States Patent
Nicholls

(10) Patent No.: US 7,733,134 B1
(45) Date of Patent: Jun. 8, 2010

(54) HIGH SPEED LOW NOISE SWITCH

(75) Inventor: Charles Nicholls, Nepean (CA)

(73) Assignee: Ciena Corporation, Linthicum, MD (US)

( * ) Notice: Subject to any disclaimer, the term of this patent is extended or adjusted under 35 U.S.C. 154(b) by 239 days.

(21) Appl. No.: 11/394,746

(22) Filed: Mar. 31, 2006

(51) Int. Cl.
*H03K 3/00* (2006.01)

(52) U.S. Cl. ...................................... 327/109; 327/379
(58) Field of Classification Search ......... 327/108–112, 327/378, 379, 383, 384, 387, 388, 389, 551
See application file for complete search history.

(56) References Cited

U.S. PATENT DOCUMENTS

| | | | | |
|---|---|---|---|---|
| 3,188,571 A * | 6/1965 | Michael | ...................... | 455/219 |
| 4,032,973 A * | 6/1977 | Haynes | ...................... | 348/682 |
| 4,037,057 A * | 7/1977 | Ogita et al. | ...................... | 381/10 |
| 4,151,471 A * | 4/1979 | Packard et al. | ................ | 455/224 |
| 4,203,072 A * | 5/1980 | Beningfield et al. | ......... | 455/223 |
| 4,553,052 A * | 11/1985 | Takahashi | ................... | 327/65 |
| 4,607,390 A * | 8/1986 | Faugeron | ..................... | 455/143 |
| 4,779,013 A * | 10/1988 | Tanaka | ........................ | 326/27 |
| 4,893,276 A * | 1/1990 | Okuyama | .............. | 365/189.08 |
| 5,130,668 A * | 7/1992 | Emslie et al. | ................ | 330/281 |
| 5,170,489 A * | 12/1992 | Glazebrook | ................ | 455/63.1 |
| 5,604,453 A * | 2/1997 | Pedersen | .................... | 327/112 |
| 5,705,994 A * | 1/1998 | Nakayama et al. | .......... | 340/7.44 |
| 5,734,300 A * | 3/1998 | Yoder | ........................ | 330/308 |
| 5,793,226 A * | 8/1998 | Park et al. | ..................... | 326/86 |
| 5,874,860 A * | 2/1999 | Brunel et al. | ................ | 330/285 |
| 5,892,400 A * | 4/1999 | van Saders et al. | .......... | 330/277 |
| 5,933,021 A * | 8/1999 | Mohd | ........................... | 326/30 |
| 6,347,146 B1 * | 2/2002 | Short et al. | .................... | 381/15 |
| 6,404,281 B1 * | 6/2002 | Kobayashi | .................... | 330/85 |
| 6,778,018 B2 * | 8/2004 | Joly et al. | ..................... | 330/296 |
| 7,078,963 B1 * | 7/2006 | Andersen et al. | ................ | 330/10 |
| 2002/0080456 A1 * | 6/2002 | Suda et al. | .................... | 359/189 |
| 2002/0094788 A1 * | 7/2002 | Hayashi et al. | ................ | 455/73 |
| 2003/0090333 A1 * | 5/2003 | Kobayashi et al. | .......... | 331/176 |
| 2004/0008463 A1 * | 1/2004 | Brennan et al. | ............. | 361/93.1 |
| 2008/0018365 A1 * | 1/2008 | Okubo | ........................ | 327/110 |
| 2008/0100367 A1 * | 5/2008 | Hossain | ....................... | 327/389 |

FOREIGN PATENT DOCUMENTS

WO   WO2005/119912   * 12/2005

OTHER PUBLICATIONS

CD4016BM/CD4016BC Quad Bilateral Switch Data Sheet, 1997, National Semiconductor Coporation.*

* cited by examiner

*Primary Examiner*—Lincoln Donovan
*Assistant Examiner*—Thomas J Hiltunen
(74) *Attorney, Agent, or Firm*—Christopher & Weisberg, P.A.

(57) ABSTRACT

The present application discloses systems and methods to for a high speed electronic switch with the internal capability to reduce noise. This noise reduction is accomplished through a noise suppression circuit. A noise source is connected a signal source; a noise suppression circuit is electrically connected to the switching source; and a switch driver is electrically connected to a noise suppression circuit. The noise reduction unit prevents noise from being propagated from the noise source to an output switch, thereby preventing the noise from reaching the downstream signal line.

25 Claims, 8 Drawing Sheets

HIGH SPEED LOW NOISE SWITCH

CROSS-REFERENCE TO RELATED APPLICATIONS

Not Applicable.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to signal processing and transport and, more particularly, to a method and apparatus for reducing noise in high speed switching circuits.

BACKGROUND OF THE INVENTION

Wireless technology involves the sending and receiving of signal transmissions through switching devices. Current and future wireless technology is becoming more heavily reliant on high speed switching to provide platform flexibility and functionality. Inherent in this high speed switching is the problem associated with noise. Reducing the amount of noise within a signal transmission creates a correlated gain in the linearity of signals and improves the quality of signal transmission.

Noise is often created by devices such as amplifiers. Amplifiers are necessary to provide functionality such as adjusting clock signal characteristics but carry the cost of added noise. As the switching time within the wireless technology continues to decrease, the effect of this noise increases. Finding ways to improve signal quality through reduced noise remains a challenge in all fields of signal processing.

SUMMARY OF THE INVENTION

The present application discloses systems and methods to for a high speed electronic switch with the internal capability to reduce noise. This noise reduction is accomplished through a noise suppression circuit. A noise source is connected to a signal source, a noise suppression circuit is electrically connected to the switching source, and a switch driver is electrically connected to a noise suppression circuit. A noise suppression circuit prevents noise from being propagated from the noise source to an output switch, thereby preventing the noise from reaching the downstream signal line.

The noise reduction may also be accomplished by connecting at least one upstream signal source to a noise suppression circuit, connecting at least one noise suppression circuit to a switch driver, controlling the noise suppression circuit through an upstream signal source, and creating a ground using complementary gates within the noise suppression circuit and the switch driver in the absence of an upstream signal from the upstream signal source. In this way, the circuit may send any noise that is created or being propagated through a signal line to ground. When there is no signal from the upstream signal source, the noise suppression circuit may be configured to send all noise that is created by other elements of the circuit, such as a limiting amplifier, to ground.

Another way that the noise reduction unit may function is by transmitting a first signal from a switching signal source into a limiting amplifier, converting the first signal in the limiting amplifier into a second signal, transmitting the second signal from the limiting amplifier to the noise suppression circuit, and blocking noise from the limiting amplifier when the second signal is not being transmitted by creating a ground in the circuit.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Figure 1:
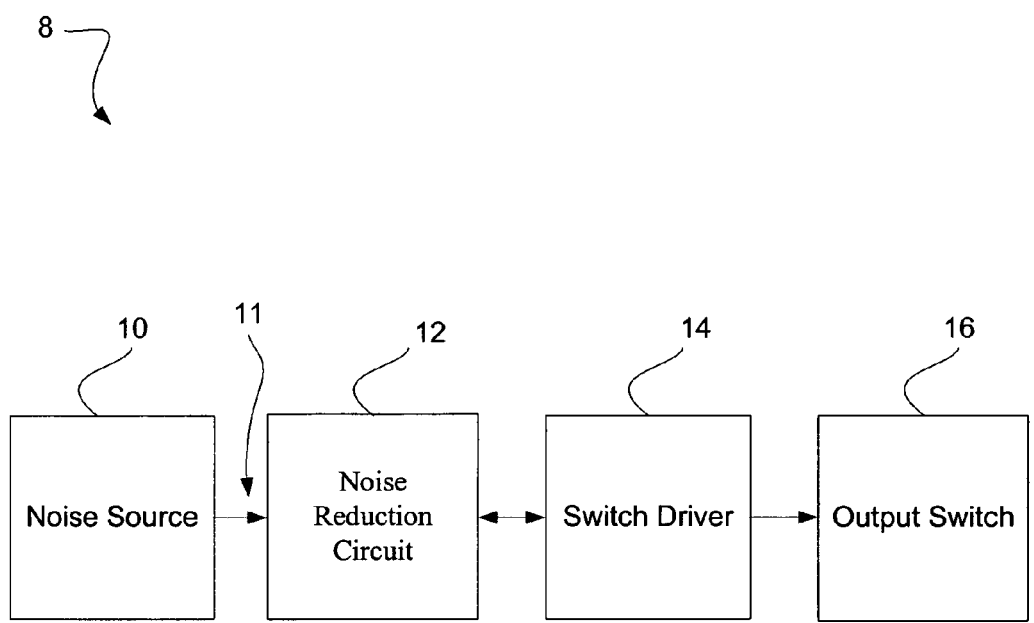
FIG. 1 is an overview of one embodiment of the noise suppression unit.

In an embodiment shown in FIG. 1, the high speed, low noise switch 8, also referred to herein as a noise reduction or suppression unit, comprises at least a noise source 10, a noise reduction circuit 12, a switch driver 14, and an output switch 16. The noise source 10 is electrically connected to the noise reduction circuit 12. Switch driver 14 is electrically connected to the noise reduction circuit 12 and output switch 16.

The use of the noise reduction unit, in one preferred embodiment, includes a source signal being electrically introduced into the noise source 10. The source signal is also referred to herein as the first signal. The source signal may be any signal, including a signal created by a switching signal source such as an application specific integrated circuit (ASIC). A second signal 11 is electronically transmitted from noise source 10 into the noise reduction circuit 12. Second signal 11 may be a modified first (e.g., amplified first signal), or a signal created by noise source 10. If a first signal is present, second signal 11 is electrically transmitted from the noise reduction circuit 12 to the switch driver 14. If no first signal is present, second signal 11 is grounded, thereby eliminating pass through of noise generated in noise source 10 into the output switch 16.

In an embodiment such as that shown in FIG. 1, the noise source 10 is any device that introduces noise that may pass from the noise source into one or more subsequent (i.e., downstream) components such as the switch driver 14 and/or the output switch 16. Examples of noise sources include differential amplifiers, limiting amplifiers, and buffering amplifiers. In this embodiment, the noise source is capable of adjusting the characteristics of the source signal (e.g., a signal from a switching source). For example, the noise source 10 may adjust the clock level of a source signal to the level required to operate the switch driver 14 while maintaining operating clock transition times. In this way, the noise source 10 prepares the first signal to be used by the switch driver 14. One drawback of using noise source 10 is that the required voltage needed to drive noise source 10 creates a corresponding level of noise. The noise that is created by the noise source 10 can be referred to as noise voltage. If no signal, or a very weak signal, was introduced into the noise source 10, noise may still be created by the noise source 10 causing the creation of second signal 11, which may pass through as noise to the subsequent components. For the purpose of clarity, any signal electrically transmitted from the noise source 10 to the noise reduction circuit 12 will be referred to as a second signal 11.

The noise reduction circuit 12, in conjunction with the switch driver 14, is capable of blocking second signal 11 when no first signal is present. In the absence of a first signal, the noise source 10 still generates noise, which if not grounded, would enter output switch 16. The noise reduction circuit contains at least one gate device (e.g., a first and/or second gate device) that is attached to the switch driver 14. This gate device (e.g., first and/or second gate device) is configured to pull another gate (e.g., a third and/or fourth gate device, as described below) found within the switch driver device 14 to ground potential when turned ON, thereby effectively shorting second signal 11 when no first signal is present. By shorting second signal 11, the noise voltage is grounded and prevented from being electronically transferred to output switch 16. Any type of field effect technology gate (FET) may be used as a gate device. Examples of devices that can be used as gate devices include High Electron Mobility Transistor (HEMT) devices, pseudomorphic high electron mobility transistor (pHEMT) devices, metamorphic high electron mobility transistor (mHEMT) devices, or other gate devices suitable for high speed transitions. For example, in one preferred embodiment, a Triquint semiconductor 0.5 um pHEMT GaAs device technology can be used to implement the invention to achieve optimum noise and speed of the circuit.

In some embodiments, the switch driver 14 contains at least two gate devices (e.g, third and fourth gate devices) which are complementary to a gate device (e.g., a fifth gate device) located within the output switch 16. One of the gate devices within switch driver 14 (i.e., the third gate device) is used to charge the gate device located in the output switch 16 (e.g., a fifth gate device) in the ON state, and the other gate device within switch driver 14 (e.g., the fourth gate device) is used to discharge the gate device within output gate 16 (e.g., the fifth gate device). The complementary gate devices within the switch driver (e.g., the third and fourth gates) alternate between the ON and OFF states. The OFF state is achieved by lowering the voltage at the OFF state gate device below the pinch-off. One problem with using these transition states is that in the OFF state the impedance of the gate device is sufficiently high such that noise from the noise source 10 can establish a significant noise voltage on the gate device and the subsequent signal. The gate devices are activated by a control signal applied to a gate placed in the opposing position within the switch driver 14. The control signal, in some embodiments, is either the first signal, or a signal that either is synchronized in phase, or out of phase, with the first signal. Because the gate of the OFF state is high impedance, and the current source in the noise source is high impedance, there exists an impedance match between the gate of the switch driver 14 and noise source 10.

The problem of noise is addressed by noise reduction circuit 12 through the use of additional transistors (e.g., the first and/or second gates) to connect each of the driver gate devices (e.g., the third and fourth gates) to ground potential. The control signals applied to these 'gate clamp' devices (e.g., the first and/or second gates) are taken from the control signal of the opposing complementary stage gate signal to which the gate clamp is attached. The 'gate clamp' device phrase refers to a gate device (e.g., the first and/or second gates) which is also operably connected to a ground state. The gate clamp element is consequently ON when the device to which it is attached to is in the OFF state. The gate clamp lowers the impedance of the driver circuit gates to the ON state resistance of the gate clamp when the switch driver device is in the OFF state. Because the gate of the OFF state is high impedance, and the current source in the noise source is high impedance, there exists an impedance match between the gate of the switch driver 14 and noise source 10. The impedance match between the noise source 10 and the switch driver 14 enables effective noise transfer between the noise source 10 and the switch driver 14. Therefore, noise that was being transferred from the noise source 10 to the switch driver 14 is clamped to ground, and therefore stopped from reaching the output switch 16 when no first signal is present. In this manner, the switch driver devices are no longer susceptible to the preceding stage noise while in the OFF state.

In the embodiment in FIG. 1, the output switch 16 contains at least one gate device (e.g., the fifth gate device). This gate device allows for a signal to be electronically transmitted from the switch driver 14 to the output switch 16. The output switch 16 is selected to meet performance requirements of insertion loss, linearity, and switching speed based upon the requirements of the circuit application. In an embodiment, the output switch 16 is a sub nanosecond switch.

Figure 2:
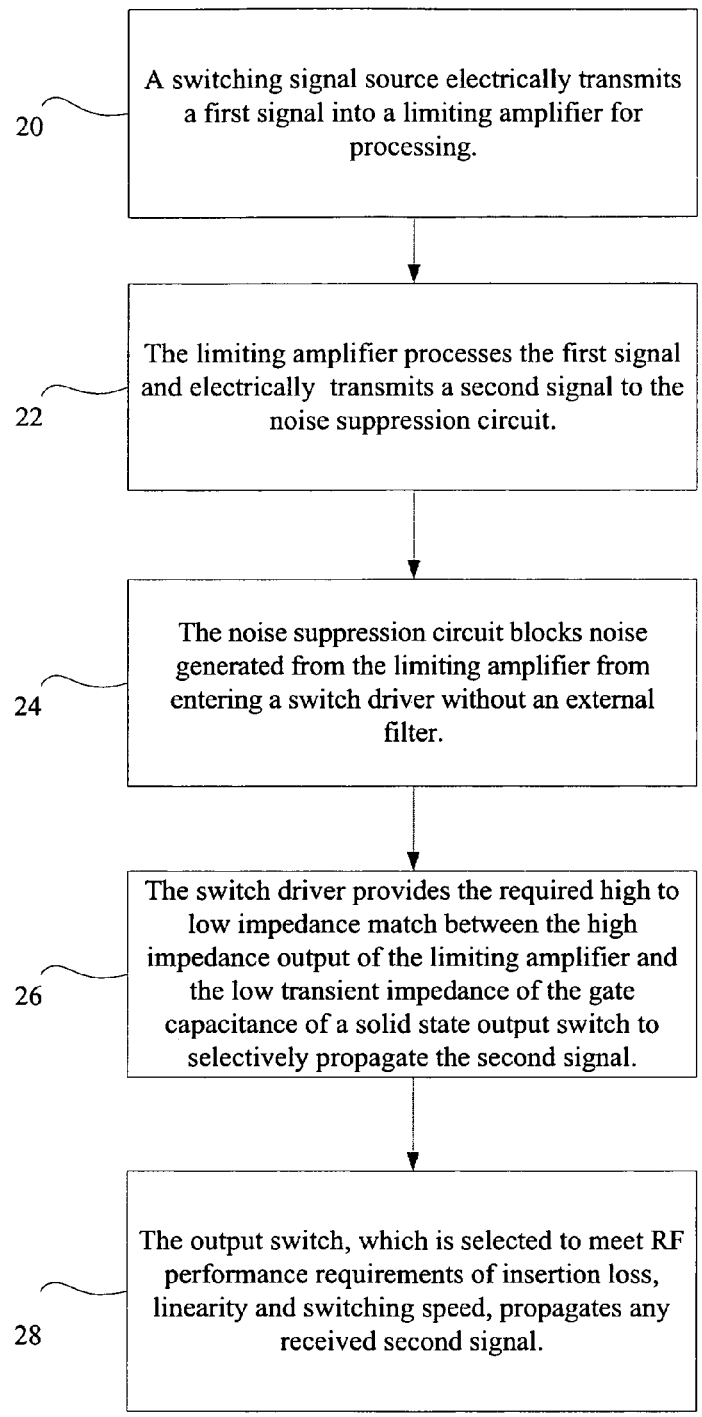
FIG. 2 is a block diagram of one embodiment of the noise suppression unit.

FIG. 2 is a block diagram of one method of implementing the noise reduction unit shown by FIG. 1. In this method, a switching signal source electrically transmits a first signal into a limiting amplifier for processing (block 20). The limiting amplifier processes the signal and electrically transmits a second signal to the noise suppression circuit (block 22). The noise suppression circuit blocks pure noise generated from the limiting amplifier from entering the switch driver without an external filter (block 24). The term "pure noise" is intended to refer to any second signal created in the absence of a first signal. When the switching signal source has electrically transmitted a signal to the limiting amplifier, that signal is permitted to pass through the noise suppression circuit. The switch driver provides the required high to low impedance match between the high impedance output of the limiting amplifier and the low transient impedance of the gate capacitance of a solid state output switch (block 26). The output switch, which is selected to meet radio frequency (RF) signal performance requirements of insertion loss, linearity and switching speed, propagates signals which are not the result of pure noise from the limiting amplifier (block 28). RF signals generally refer the portion of the electromagnetic spectrum in which electromagnetic waves can be generated by alternating current fed to an antenna.

Figure 3:
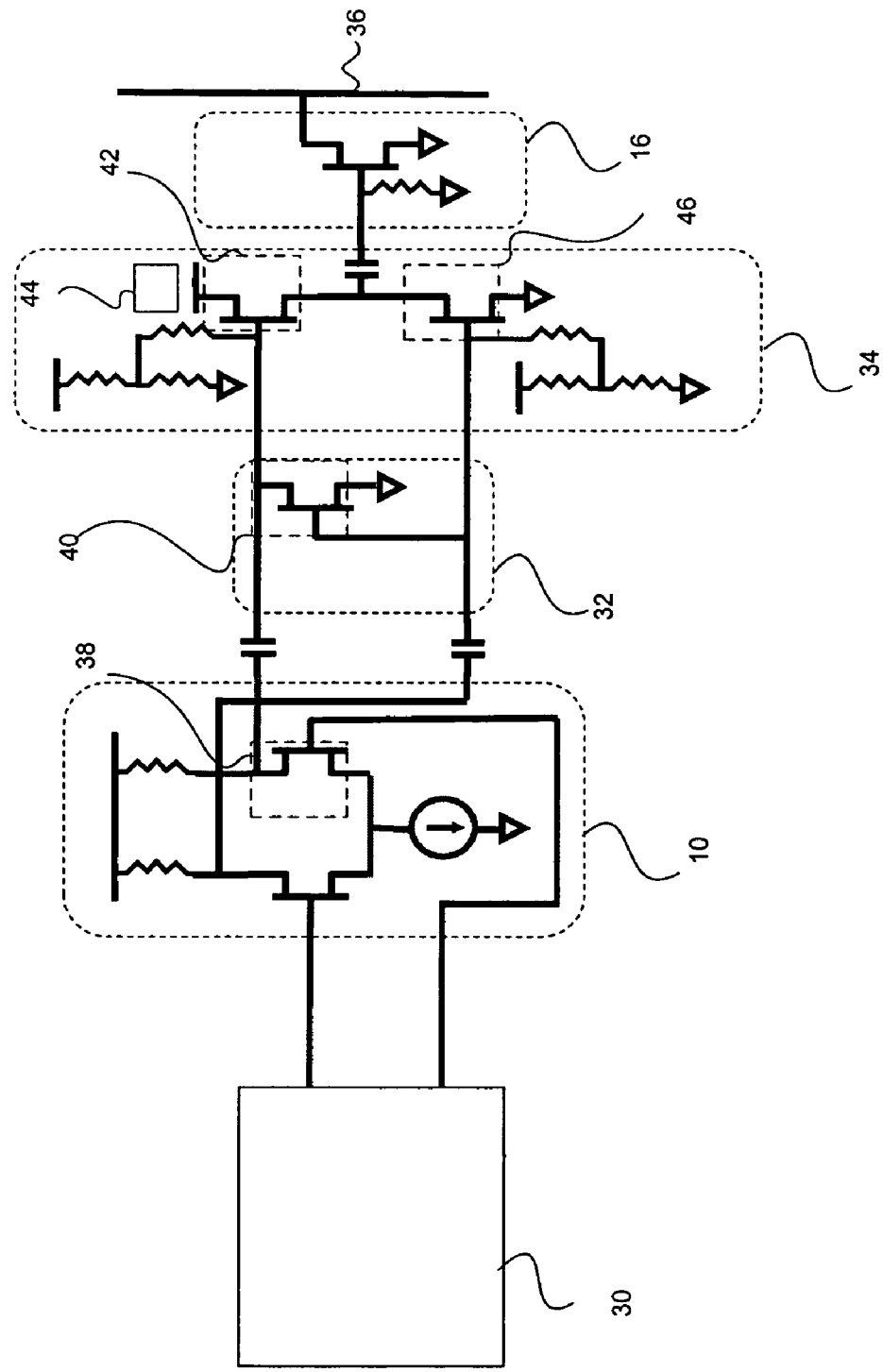
FIG. 3 is a circuit drawing of a single gate clamp embodiment of the noise suppression unit.

One example of a circuit configuration that is consistent with the present disclosure is shown in FIG. 3. In this diagram, a switching source (e.g., Voltage Controlled SAW Oscillators, "VCSO") 30, noise source 10, a noise suppression circuit 32, a switch driver 34, an output switch 16, and an RF signal line 36 are shown. The noise source 10 is in the form of a representative limiting amplifier. A limiting amplifier gate 38 inverts the output from the noise source 10. A control signal in the form of a voltage source 44 is used to drive the switch driver 34. When the limiting amplifier gate 38 is ON, it pulls the drain of the limiting amplifier gate 38 low and causes a first switch driver gate 42 to be in the OFF state. When the noise suppression circuit gate 40 within the noise suppression circuit 32 is ON, it pulls a second switch driver gate 46 low, so that the second switch driver gate 46 is in the OFF state. In this embodiment, the noise suppression circuit gate 40 is used to clamp the switch driver 34 to ground.

Figure 4:
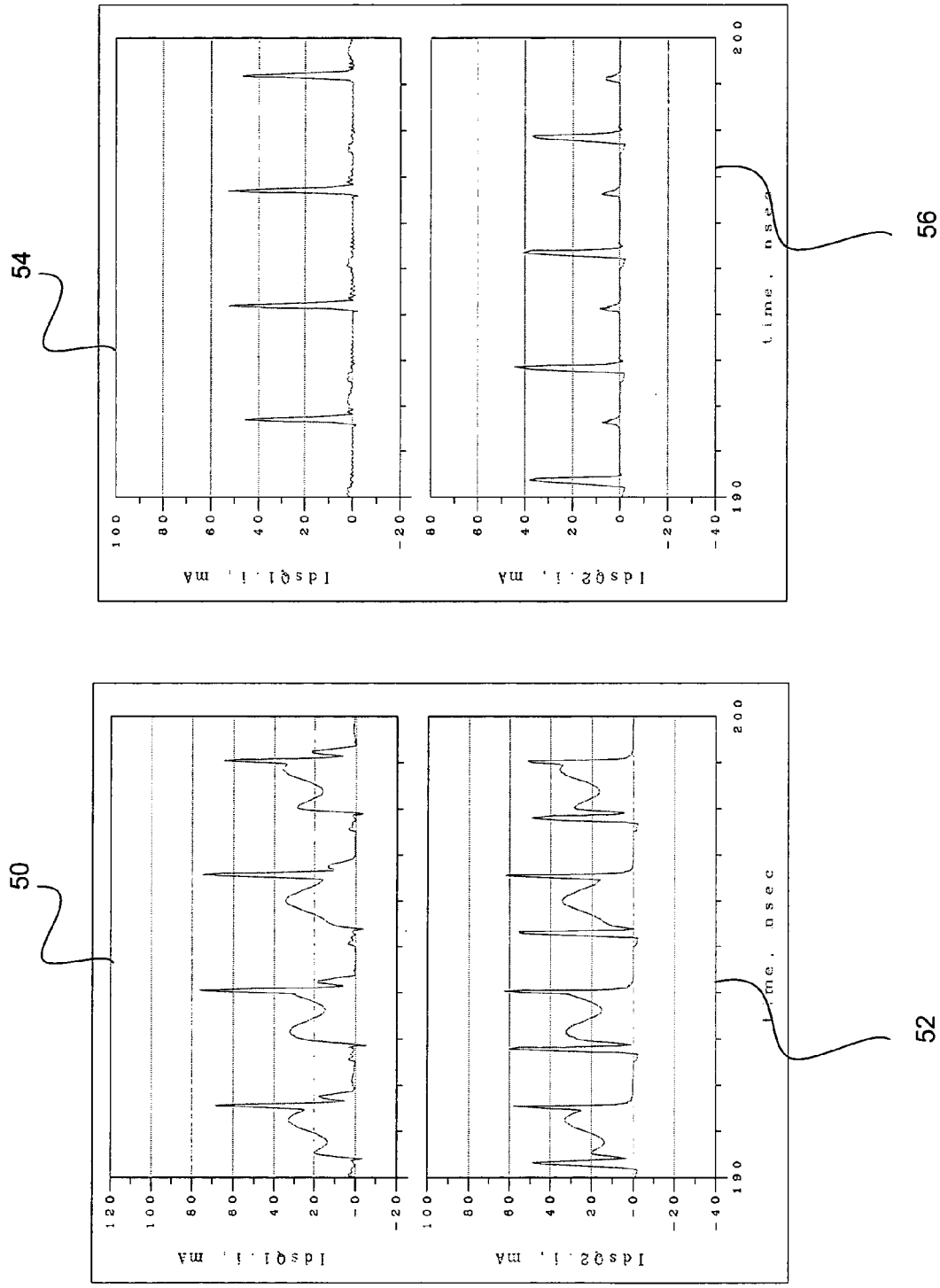
FIG. 4 is a graphical illustration of the results using the single gate clamp embodiment of the noise suppression unit.

The simulated results using this design are illustrated by FIG. 4. In this figure, the switch driver drain current profile is simulated at the limiting amplifier gate 38 and the noise suppression circuit gate 40 with applied noise. The results at the noise suppression circuit gate 40 are shown by a first graph 50 when noise is applied without the gate clamp and a second graph 54 when noise is applied with the gate clamp. The results at limiting amplifier gate 38 are shown by a first graph 52 when noise is applied without the gate clamp, and a second graph 56 when noise is applied with the gate clamp. These results are simulation outputs created by the application of a signal to the circuit illustrated by FIG. 3.

Figure 5:
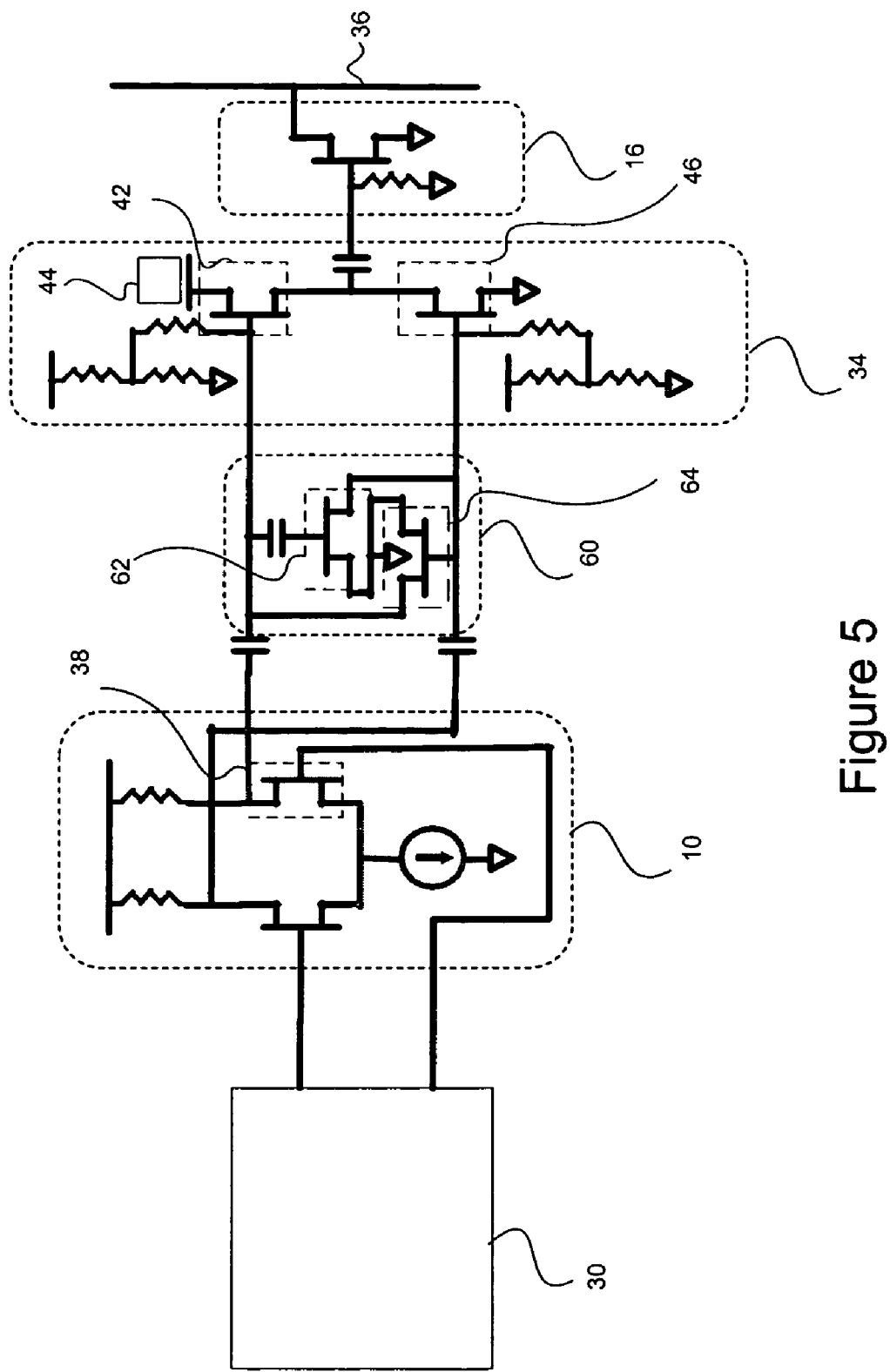
FIG. 5 is a circuit drawing of a first dual gate clamp embodiment of the noise suppression unit.

One example of a dual gate clamp configuration of a noise reduction circuit consistent with the present disclosure is shown in FIG. 5. In this diagram, switching source (e.g., VCSO) 30, a noise source 10, a noise suppression circuit 60, a switch driver 34, an output switch 16, and an RF signal line 36 are shown. The design and implementation of the noise suppression circuit 64 includes a dual clamp configuration including a first noise suppression circuit gate 62 and a second noise suppression circuit gate 64. The noise source 10 is in the form of a representative limiting amplifier. A control signal in the form of a voltage source 44 is used to drive the switch driver 34.

In this embodiment, the first noise suppression circuit gate 62 and the second noise suppression circuit gate 64 are driven by the noise source 10 and the noise source gate 38. The first noise suppression circuit gate 62 and the second noise suppression circuit gate 64 are used to clamp the first switch driver gate 42 and second switch driver gate 46 of the switch driver 34 to ground when the first noise suppression circuit gate 62 and the second noise suppression circuit gate 64 are in the OFF state.

Figure 6:
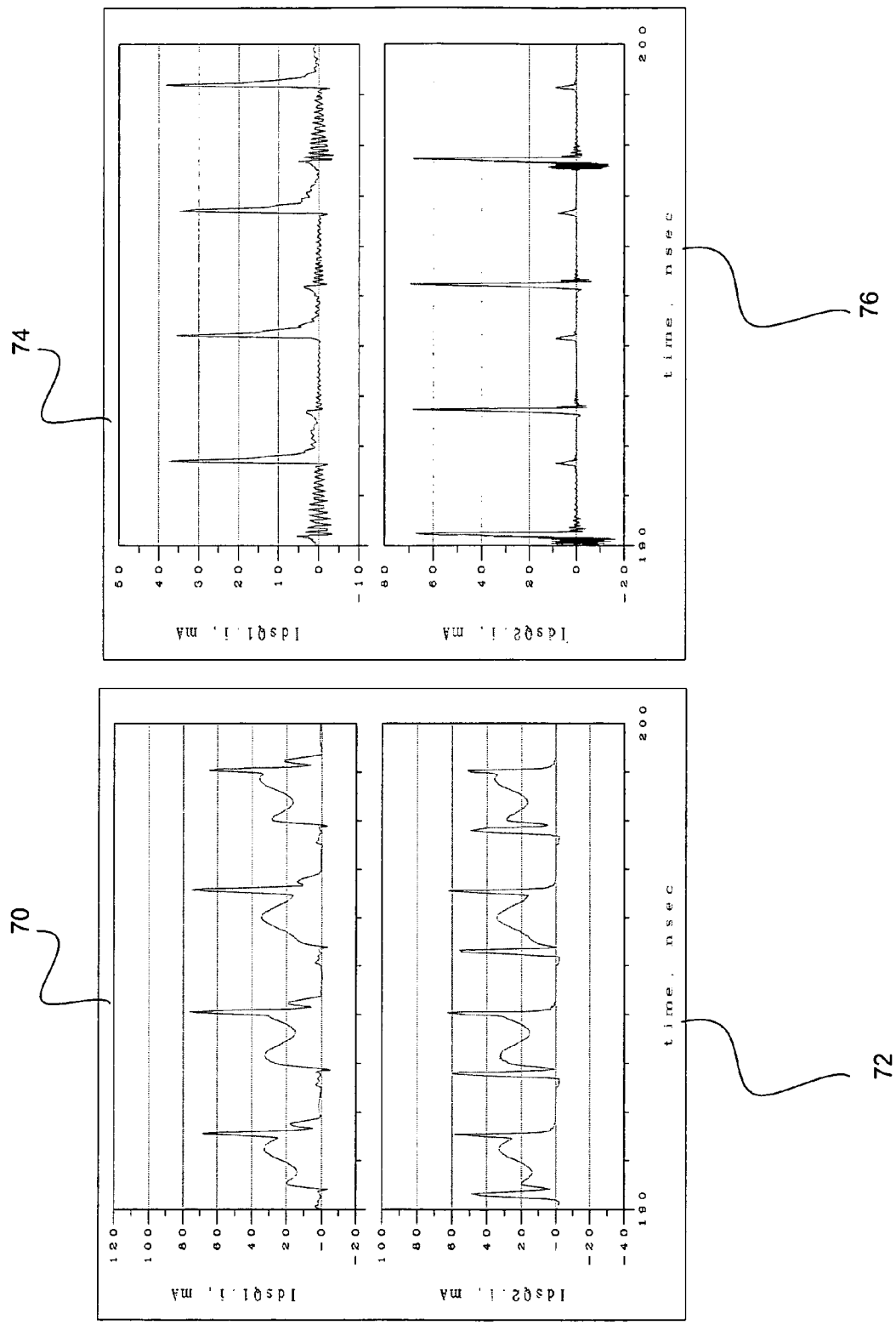
FIG. 6 is a graphical illustration of the results using a first dual gate clamp embodiment of the noise suppression unit.

The simulated results using this design are illustrated by FIG. 6. In this figure, the switch driver drain current profile is simulated at the first noise suppression circuit gate 62 and the second noise suppression circuit gate 64 with applied noise. The results at the first noise suppression circuit gate 64 are shown by a first graph 70 when noise is applied without the gate clamp and a second graph 74 when noise is applied with the gate clamp. The results at the first noise suppression gate 62 are shown by a first graph 72 when noise is applied without the gate clamp, and a second graph 76 when noise is applied with the gate clamp. The use of the dual clamp embodiment provides a significant reduction of noise as compared to the single clamp embodiment. These results are simulation outputs created by the application of a signal to the circuit illustrated by FIG. 5.

Figure 7:
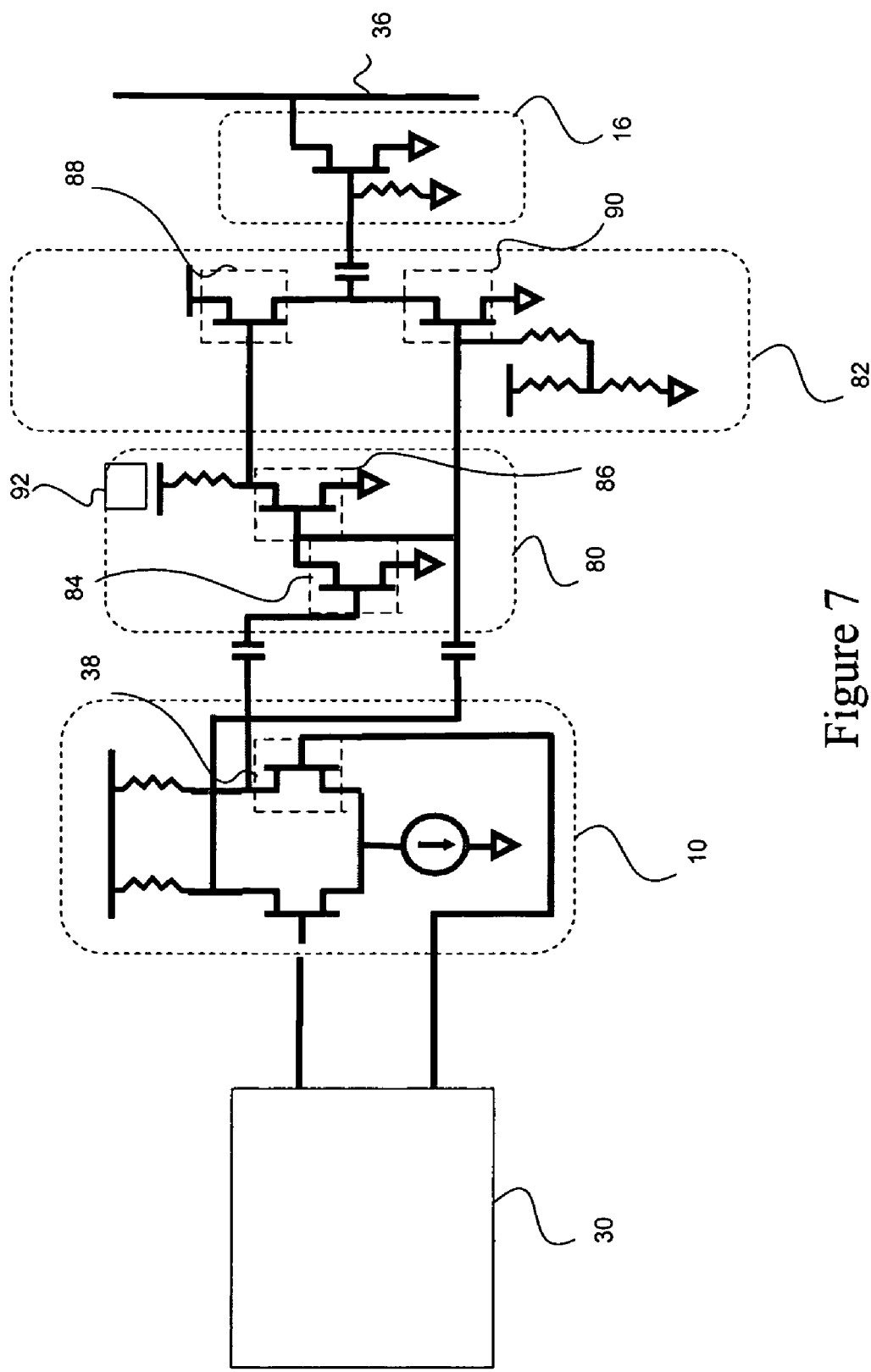
FIG. 7 is a circuit drawing of a second dual gate clamp embodiment of the noise suppression unit.

A second example of a dual gate clamp configuration of a noise reduction circuit consistent with the present disclosure is shown in FIG. 7. The operation of the gate devices within second example of a dual gate clamp configuration operates similarly to the operation of the first example of the dual gate clamp configuration. In this figure switching source (e.g., VCSO) 30, noise source 10, a noise suppression circuit 80, a switch driver 82, output switch 16, and RF signal line 36 are shown. The design and implementation of the noise suppression circuit 80 includes a dual clamp configuration including a first noise suppression circuit gate 84 and a second noise suppression circuit gate 86. The noise source 10 is in the form of a representative limiting amplifier. In this embodiment, the second noise suppression circuit gate 86 is connected to ground. In addition, the second noise suppression circuit 86 has a voltage source 92. The first noise suppression circuit gate 84 and a second noise suppression circuit gate 86 commute to control the state of a first noise suppression circuit gate 88 and a second noise suppression circuit gate 90.

Figure 8:
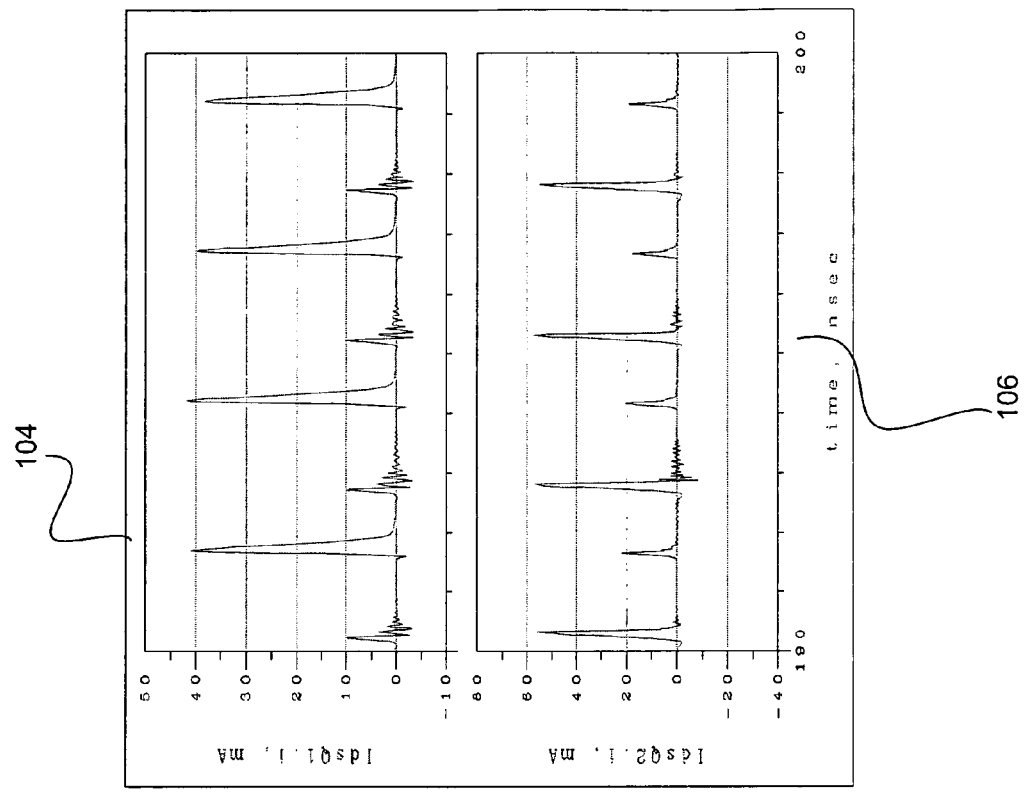
FIG. 8 is a graphical illustration of the results using a second dual gate clamp embodiment of the noise suppression unit.
Figure 8:
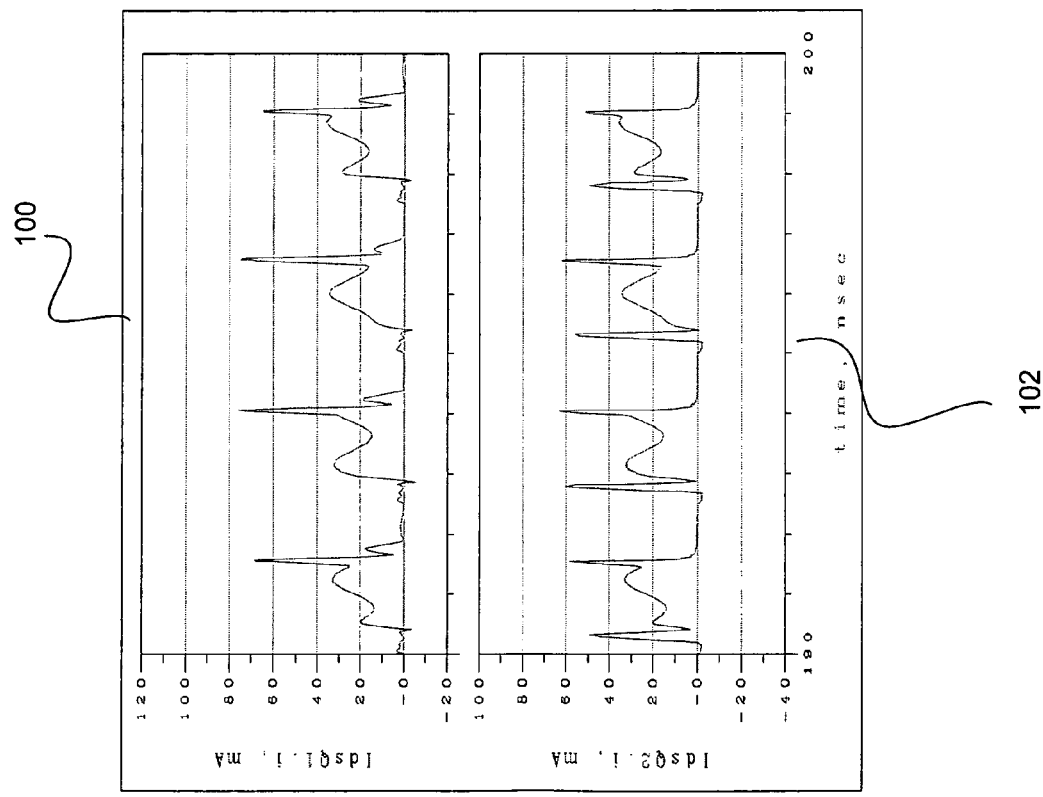

The simulated results of using this design are illustrated by FIG. 8. In this figure, the switch driver drain current profile is simulated at the first noise suppression circuit gate 84 and the second noise suppression circuit gate 86 with applied noise. The results at the first noise suppression circuit gate 84 are shown by a first graph 100 when noise is applied without the gate clamp and a second graph 104 when noise is applied with the gate clamp. The results at the first noise suppression gate 86 are shown by a first graph 102 when noise is applied without the gate clamp and a second graph 106 when noise is applied with the gate clamp. These results are simulation outputs created by the application of a signal to the circuit illustrated by FIG. 7.

One preferred embodiment of the present disclosure may be used in numerous wireless front end systems which require high speed high linearity switching with associated low noise. One application of the present disclosure is in cost reducing initiatives for wireless base transceiver stations involving multiplexing of signals to the masthead, thereby allowing for the elimination of certain cables between the base and masthead electronics as an enabling technology for low noise high linearity serrodyne frequency translation. This disclosure can also be applied in Time Division Duplex (TDD) radio architectures and in all digital radio units. The noise suppression gained as a result of implementing some of the disclosed embodiments is between 6 to 8 dB.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

I claim:

1. A high speed low noise switch, comprising:
a noise source electrically connected to an upstream radio frequency signal source;
a noise suppression circuit comprising at least one field effect transistor operably connected to ground and electrically connected to the noise source; and
a switch driver electrically connected to the noise suppression circuit and a solid state output switch, wherein the switch driver comprises two transistors of a class of high electron mobility transistor (HEMT) field effect transistors, wherein the switch driver provides a high to low impedance match between a high impedance output of a limiting amplifier and a low transient impedance of the gate capacitance of the output switch, wherein the at least one field effect transistor of the noise suppression circuit is turned on when the upstream radio frequency signal source is absent, wherein when the at least one field effect transistor of the noise suppression circuit is on, the at least one field effect transistor of the noise suppression circuit pulls a gate of one of the two transistors of the switch driver low and clamps the switch driver output to ground, and wherein the high speed low noise switch operates independently of a negative voltage supply.

2. The high speed low noise switch of claim 1, wherein the upstream signal source and output switch carry RF signals.

3. The high speed low noise switch of claim 1, wherein the noise suppression circuit contains at least one gate capable of creating a short circuit.

4. The high speed low noise switch of claim 1, wherein at least one of the high electron mobility transistor field effect transistors of the switch driver comprises a gate that is electrically coupled to a ground.

5. The high speed low noise switch of claim 1, wherein one of the high electron mobility transistor field effect transistors of the switch driver has a gate that is used to pull a gate of the noise suppression circuit, causing the switch driver to transfer the noise to ground.

6. The high speed low noise switch of claim 1, wherein the noise suppression circuit comprises at least two field effect transistor gates.

7. The high speed low noise switch of claim 1, wherein the noise suppression circuit further comprises at least one capacitor.

8. The high speed low noise switch of claim 1, wherein the noise suppression circuit further comprises at least one connection to a ground.

9. The high speed low noise switch of claim 1, wherein the at least one transistor of the class of high electron mobility transistor field effect transistors of the switch driver is one of a high electron mobility (HEMT) field effect transistor (FET), a pseudomorphic high electron mobility transistor (pHEMT) field effect transistor, and a metamorphic high electron mobility transistor (mHEMT) field effect transistor.

10. The high speed low noise switch of claim 1, wherein the at least one transistor of the class of high electron mobility transistor field effect transistors of the switch driver uses pseudomorphic high electron mobility transistor (pHEMT) gallium arsenide (GaAs) technology.

11. The high speed low noise switch of claim 1 wherein the noise source comprises the limiting amplifier.

12. A method of reducing noise, comprising:
electrically connecting at least one upstream signal source to a noise suppression circuit, wherein the upstream signal source is a radio frequency signal;
electrically connecting the noise suppression circuit to a switch driver, wherein the radio frequency signal is propagated through the noise suppression circuit to the switch driver substantially without shifting the frequency of the radio frequency signal of the upstream signal source;
controlling the noise suppression circuit through the upstream signal source; and
creating a ground using complementary gates within the noise suppression circuit and the switch driver in the absence of an upstream signal from the upstream signal source.

13. The method of claim 12, wherein the noise suppression circuit contains at least two gates.

14. The method of claim 12, wherein the noise suppression circuit contains a connection from at least one gate to a ground.

15. The method of claim 12, wherein the noise suppression circuit contains a connection from at least one gate to a capacitor.

16. The method of claim 12, further comprising the step of creating a short through a connection to a ground through the noise suppression circuit.

17. The method of claim 12, wherein the radio frequency signal has a frequency of at least 500 megahertz.

18. The method of claim 12, wherein the complementary gates are field effect transistors.

19. A method of reducing noise, comprising:
transmitting a first signal from a switching signal source into a limiting amplifier, wherein the first signal is a first radio frequency signal;
converting the first signal in the limiting amplifier into a second signal, wherein the second signal is a second radio frequency signal and the second radio frequency signal is substantially the same frequency as the first radio frequency signal;
transmitting the second signal from the limiting amplifier to a noise suppression circuit;
blocking noise from the limiting amplifier when the second signal is not being transmitted by the absence of the second signal creating a ground in the noise suppression circuit; and
not blocking noise from the limiting amplifier when the second signal is being transmitted.

20. The method of claim 19, wherein the switching signal source is a Voltage Controlled SAW Oscillators source.

21. The method of claim 19, wherein the noise suppression circuit contains at least one operable connection to a ground.

22. The method of claim 19, wherein the noise suppression circuit contains at least two gates.

23. The method of claim 19, wherein the switch driver contains at least one operable connection to a ground.

24. The method of claim 19, wherein the limiting amplifier contains at least one inverting gate.

25. The method of claim 19, wherein the switching signal source is an application specific integrated circuit (ASIC).

* * * * *